United States Patent
Mimura et al.

(10) Patent No.: US 7,003,872 B2
(45) Date of Patent: Feb. 28, 2006

(54) ELECTRONIC COMPONENT MOUNTING APPARATUS AND METHOD

(75) Inventors: Naoto Mimura, Higashiyatsushiro-gun (JP); Izumi Miura, Nakakoma-gun (JP); Hirofumi Obara, Nakakoma-gun (JP); Hiroshi Uchiyama, Kofu (JP); Nobuyuki Kakita, Kofu (JP); Kazunori Kanai, Kofu (JP); Osamu Okuda, Nakakoma-gun (JP); Akira Kabeshita, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/503,497

(22) PCT Filed: Feb. 6, 2003

(86) PCT No.: PCT/JP03/01216

§ 371 (c)(1),
(2), (4) Date: Aug. 5, 2004

(87) PCT Pub. No.: WO03/067951

PCT Pub. Date: Aug. 14, 2003

(65) Prior Publication Data

US 2005/0125998 A1    Jun. 16, 2005

(30) Foreign Application Priority Data

Feb. 7, 2002    (JP)    ............................ 2002-030930

(51) Int. Cl.
H05K 3/30     (2006.01)
B23P 19/00    (2006.01)

(52) U.S. Cl. ..................... 29/832; 29/564.1; 29/721; 29/739; 29/740; 29/840

(58) Field of Classification Search ............ 29/564.1, 29/721, 739, 740, 832, 840
See application file for complete search history.

(56) References Cited

U.S. PATENT DOCUMENTS

| | | | | |
|---|---|---|---|---|
| 5,249,356 A | * | 10/1993 | Okuda et al. ................ | 29/833 |
| 5,566,447 A | * | 10/1996 | Sakurai ..................... | 29/832 |
| 5,778,525 A | * | 7/1998  | Hata et al. .................. | 29/836 |
| 5,839,186 A | * | 11/1998 | Onodera ..................... | 29/720 |
| 5,864,944 A | * | 2/1999  | Kashiwagi et al. .......... | 29/833 |
| 6,036,425 A |   | 3/2000  | Seto                        |        |
| 6,408,505 B1| * | 6/2002  | Hata et al. .................. | 29/740 |

FOREIGN PATENT DOCUMENTS

JP    10-270894    10/1998

* cited by examiner

*Primary Examiner*—Carl J. Arbes
(74) *Attorney, Agent, or Firm*—Wenderoth, Lind & Ponack, L.L.P.

(57) ABSTRACT

An apparatus and a method for mounting electronic components are provided which shorten a cycle time required for mounting and enable a component mounting machine to be arranged in a small area. There is provided a controller, so that a retreat control for a second electronic component is performed to a second component feeder so as to avoid an interference if a first electronic component or a component holder interferes with the second electronic component of the second component feeder because of movement of a mounting head. The time conventionally required for moving up and down a component holder can be reduced, and moreover the need of uselessly moving along a detour at a time of moving the mounting head is eliminated. The cycle time can be shortened, and eventually costs can be reduced.

6 Claims, 6 Drawing Sheets ved by an XY-robot 17 in X and Y-directions; reference
ELECTRONIC COMPONENT MOUNTING APPARATUS AND METHOD

TECHNICAL FIELD

The present invention relates to an apparatus and a method for mounting electronic components for mounting electronic components to a circuit board, particularly relates to an electronic component mounting apparatus in which supply of the electronic components is carried out from feeders of many kinds such as so-called cassette type and tray type, and moreover component holders which move with holding the electronic components pass over a tray at the above tray type component feeder, and relates to an electronic component mounting method carried out by the mounting apparatus.

BACKGROUND ART

These days, electronic circuit boards spread widely in terms of size thereof, for example, from small ones for mobile phones and the like to large boards for servers and the like, and it is required to produce these boards most efficiently in the shortest production time. Meanwhile, a mounting apparatus of a robot type is becoming a mainstream as a form of the apparatus, which mounts electronic components by moving a working head for sucking electronic components by an XY-robot.

Hereinafter, an example of a conventional electronic component mounting apparatus will be described with reference to FIG. 5. In the drawing, reference numerals 1, 2 and 3 represent component feeders for taping components; a reference numeral 4 representing a component feeder for tray-stored components; a reference numeral 15 representing a working head with suction nozzles 16 of component holders for holding electronic components, which can be moved by an XY-robot 17 in X and Y-directions; reference numerals 5 and 6 representing recognition cameras for picking-up images of suction postures of electronic components held by the working head 15 before electronic components are mounted onto a circuit board; a reference numeral 8 representing a loader for carrying in an electronic circuit board 11 into a component mounting work zone; and a reference numeral 9 representing a circuit board transfer and hold unit comprising support rails 9a and 9b for supporting an electronic circuit board 12, which is configured so that one support rail 9b moves to a position 10 to fit the size of the largest electronic circuit board 12 to be handled. A reference numeral 13 represents an unloader for carrying out the electronic circuit board 11 from within the component mounting work zone.

The operation at the conventional electronic component mounting machine 50 constructed as above will be depicted. The electronic circuit board 11 is supported via the loader 8 by support rails 9a and 9b. The working head 15 sucks electronic components through the operation of the XY-robot 17 from the component feeder 1 for taping components by the component suction nozzles 16 installed to the working head 15. Then, the working head 15 moves to above the recognition camera 5 along a route indicated by A, so that the suction postures of electronic components held by the suction nozzles 16 are imaged by the recognition camera 5 and measured. After position corrections of the sucked electronic components are calculated on a basis of the result of the measurement, the sucked and recognized components are mounted while being positionally corrected, onto the electronic circuit board 12 by the movement of the working head 15.

Component feeders for electronic components are installed also behind the component mounting work zone of the mounting apparatus 50, as denoted by reference numerals 3 and 4. Electronic components sucked by the suction nozzles 16 from the component feeder 3 for taping components or from the component feeder 4 with tray-stored components are imaged alike by the recognition camera 6, and are mounted on the electronic circuit board 12 after the suction position postures are recognized and the position corrections are calculated. A movement route of electronic components in this case is indicated by B.

Recently, electronic components vary from a small size to a large size, and also a feed form of electronic components is diverse such as by taping, bulk, stick and tray. The electronic component mounting apparatus is roughly divided to a cassette type feeder as a feed unit for taping type, bulk type, stick type components, and a tray type feeder. Although many of electronic components can be supplied by the above cassette type feeder, electronic components fed with trays are supplied by the tray type feeder.

In a case where the cassette type component feeder and the tray type component feeder are shared as in the above-described component mounting apparatus 50 shown in FIG. 5, conventionally, the tray type component feeder is installed by utilizing a space of the cassette type component feeder. That is, the number of types of components in terms of the feed form such as taping type, bulk type and stick type to be supplied from the cassette type component feeder is reduced, and the tray type component feeder is fitted in the reduced space. As such, the arrangement has the trouble of reducing part of the component types.

In contrast, it can be so devised that a tray type component feed unit 4 is disposed between a cassette type component feeder 7 and a component mounting zone as in a component mounting apparatus 51 shown in FIG. 6, by way of example of installing the tray type component feeder without reducing part of the component types as referred to above. The arrangement eliminates the need of reducing the component types and of greatly increasing an installation area of the component mounting machine. However, in the case of this arrangement in which electronic components are held by suction nozzles 16 of the working head 15 from the cassette type component feeder 7 and moved to the component mounting zone, the held components vary in the thickness by their types, leading to the possibility of an interference between electronic components loaded on the tray type component feed unit 4 present in the movement route, and components sucked by the component suction nozzles 16 if the held components are thick. Thus the component suction nozzles 16 are required to move up for preventing the interference. However, to move up the component suction nozzles 16 to a position with a maximum component thickness taken into account increases an up-down movement distance of the component suction nozzles not only at the time of catching components from the component feeder, but also at the time of mounting components on the circuit board 12. As a result, a time necessary for component mounting becomes long and a mounting cost increases. The mounting time should be shortened for reducing the mounting cost, which necessitates to make movement distances in a horizontal direction and a vertical direction of electronic components shortest in three processes of a suction process for electronic components, a recognition process and a mounting process.

DISCLOSURE OF INVENTION

The present invention is devised to solve the aforementioned problem and has for its object to provide an electronic component mounting apparatus and an electronic component mounting method performed by the mounting apparatus, which enable a cycle time required for mounting to be shortened and also enable a component mounting machine to be installed in a small area.

In accomplishing these and other aspects, according to a first aspect of the present invention, there is provided an electronic component mounting apparatus in which a second component feeder that supplies a second electronic component is arranged at a section set between a mounting zone where a board mounting at least a first electronic component is disposed and a first component feeder that supplies the first electronic component, said electronic component mounting apparatus comprising:

a mounting head configured to have component holders that move up and down with holding the first and second electronic components, to be movable in mutually orthogonal X and Y-directions, and to hold at least the first electronic component from the first component feeder and mount the first electronic component on the board;

a second electronic component mover configured to be installed in the second component feeder, and to retreat the second electronic component when at least either of the first electronic component held by the mounting head from the first component feeder and the component holder interferes with the second electronic component of the second component feeder because of movement of the mounting head; and a controller configured to perform operation control for the first component feeder, the second component feeder, the second electronic component mover and the mounting head, and to perform operation control to the second electronic component mover when the interference arises.

The above electronic component mounting apparatus may be designed so that the apparatus further comprises an image pick-up device configured to image hold postures of the first electronic component and the second electronic component held by the mounting head, wherein the controller performs retreat control for the second electronic component to the second electronic component mover when the first electronic component interferes with the second electronic component at a time of movement for imaging the first electronic component.

The above electronic component mounting apparatus may be designed so that the controller further makes the mounting head move up the component holder to retreat the first electronic component.

The above electronic component mounting apparatus may be designed so that the controller has a memory part that stores height information of the first electronic component and the second electronic component, and determines presence or absence of the interference on a basis of the height information of the first electronic component held by the mounting head and the height information of the second electronic component at the second component feeder to perform the retreat control.

The above electronic component mounting apparatus may be designed so that the second component feeder includes a tray with the second electronic component loaded and the second electronic component mover that moves the tray.

According to a second aspect of the present invention, there is provided an electronic component mounting method performed by an electronic component mounting apparatus in which a second component feeder that supplies a second electronic component is arranged at a section set between a mounting zone where a board mounting at least a first electronic component is disposed and a first component feeder that supplies the first electronic component, the method comprising:

performing avoidance operation of interference to the second component feeder if at least either of a component holder and the first electronic component held by the component holder interferes with the second electronic component of the second component feeder when a mounting head with the component holders which move up and down with holding the first and second electronic components passes over the second component feeder.

In the second aspect, the above electronic component mounting method may be designed so that, in a case where component mounting is performed on the board after picking up image of hold postures of the first and second electronic components held by the mounting head, retreat of the second electronic component is performed to the second component feeder if the first electronic component interferes with the second electronic component at a time of imaging the first electronic component.

In the second aspect, the above electronic component mounting method may be designed so that the interference avoiding operation is performed by determining presence or absence of the interference on a basis of height information of the first electronic component held by the mounting head and height information of the second electronic component at the second component feeder.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
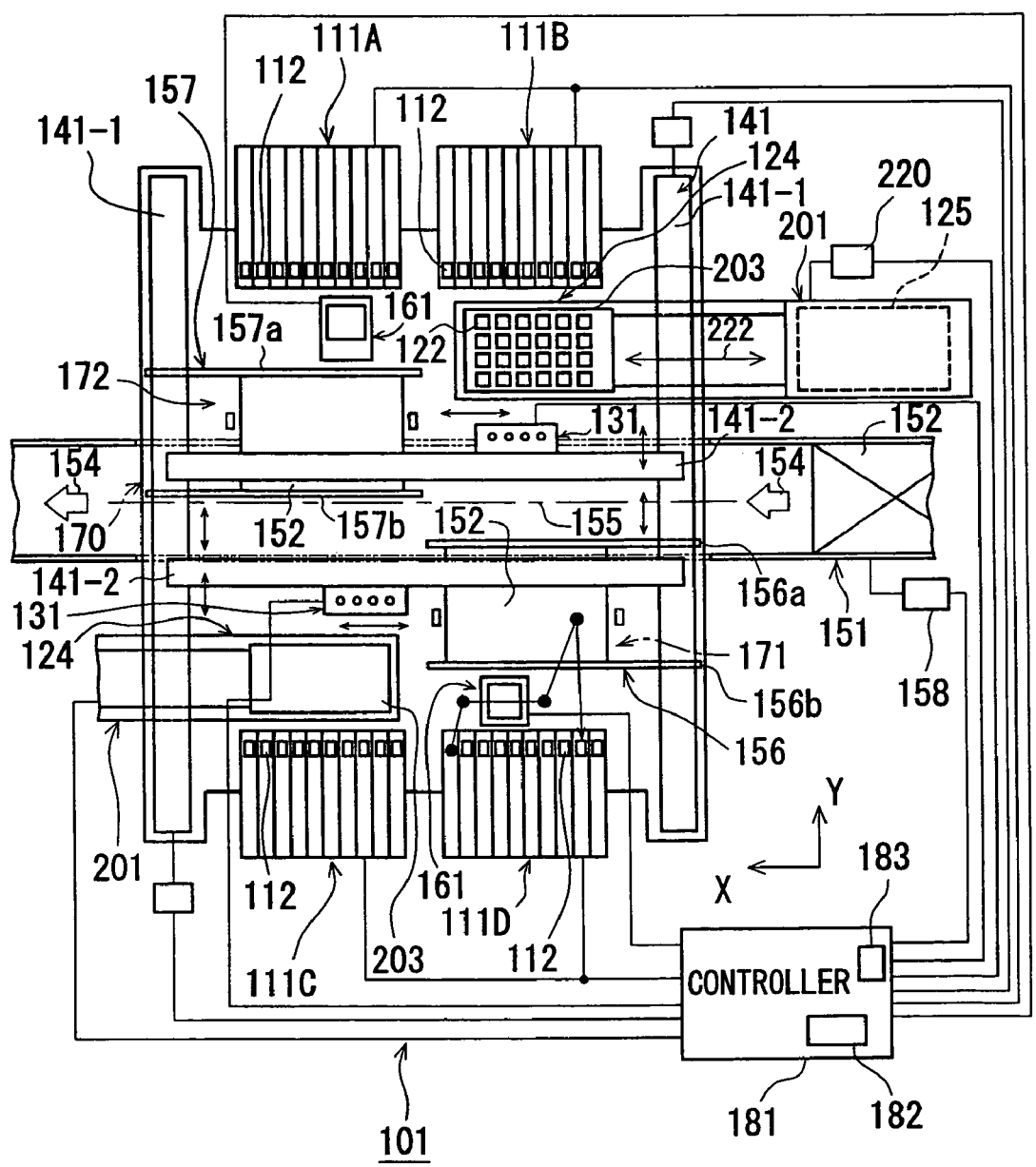
FIG. 1 is a plan view of an electronic component mounting apparatus according to an embodiment of the present invention.

Before the description of the present invention proceeds, it is to be noted that like parts are designated by like reference numerals throughout the accompanying drawings.

Hereinafter, a first embodiment of the present invention will be described in detail with reference to the drawings.

An electronic component mounting apparatus and an electronic component mounting method as the embodiment of the present invention will be depicted below with reference to the drawings. The electronic component mounting method is performed by the electronic component mounting apparatus. Like parts are designated by like reference numerals in each drawing.

Before the electronic component mounting apparatus of the instant embodiment is detailed, the apparatus will be schematically described first.

The component mounting apparatus includes first component feeders of so-called cassette type for supplying first electronic components and second component feeders of so-called tray type for supplying second electronic components, with circuit board arrangement zones where circuit boards are arranged being set at an apparatus center part. The tray type second component feeder is placed between the cassette type first component feeder and the circuit board arrangement zone. Moreover, the component mounting apparatus is equipped with mounting heads each of which is movable in mutually orthogonal X and Y-directions, has component holders movable up and down with holding at least the first electronic components from the first component feeder, and mounts the held first electronic components onto a circuit board. In this configuration, at a time of mounting the first electronic component held by the mounting head from the first component feeder to the circuit board, if the first electronic component held by the mounting head or the component holder interferes with the second electronic component placed on the tray of the second component feeder because of the movement of the mounting head, a control is executed to the second component feeder to avoid the interference.

Accordingly, in the above case, for instance, where the second electronic component on the tray has a high component height and the first electronic component held by the mounting head is high, a wasteful action of, e.g., moving the mounting head to avoid the second component feeder for preventing the interference between the first electronic component and second electronic component when the first electronic component is moved by the mounting head is eliminated. A movement distance of the mounting head from the component supply to recognition to mounting can be made shortest and a cycle time necessary for mounting operation can be shortened. Thanks to the above interference avoiding control, installation of both the cassette type first component feeder and the tray type second component feeder is enabled, and moreover both can be set adjacent to each other, so that the entire electronic component mounting apparatus can be space-saving.

Now, the configuration of the above electronic component mounting apparatus will be described more in detail.

The electronic component mounting apparatus 101 of the present embodiment shown in FIG. 1 has fundamentally cassette type first component feeders 111, tray type second component feeders 201, mounting heads 131 and a controller 181 for performing an operation control of the electronic component mounting apparatus 101, and can further be equipped with an image pick-up device having image pick-up cameras 161. Also a circuit board transfer device 151 for transferring a circuit board 152 to the electronic component mounting apparatus 101 is installed.

In the electronic component mounting apparatus 101 of the embodiment with the aforementioned constituent parts, the circuit board transfer device 151 is arranged at a central part of the apparatus along a transfer direction 154 of the circuit board 152, namely, an X-direction. Each of the above-described constituent parts is disposed fundamentally symmetrically with respect to a center line 155 as illustrated. In other words, every two of first component feeders 111A and 111B, and first component feeders 111C and 111D are arranged at side ends located in parallel to the transfer direction 154 in the electronic component mounting apparatus 101, and a tray 203 installed in the second electronic component feeder 201 is arranged at a tray component feed position 124 between the first component feeder 111B and the circuit board transfer device 151. As indicated in the drawing, the tray 203 of the second electronic component feeder 201 can be arranged also in a section held between the first component feeder 111C and the circuit board transfer device 151. The image pick-up cameras 161 of the image pick-up device are arranged adjacent to the first component feeder 111A and the first component feeder 111D, respectively. A mounting head moving unit 141 is arranged so that the mounting head 131 can move over the circuit board transfer device 151, the trays 203, the image pick-up cameras 161 and the first component feeders 111.

Each of the constituent parts arranged as above will be depicted in detail below.

Figure 2:
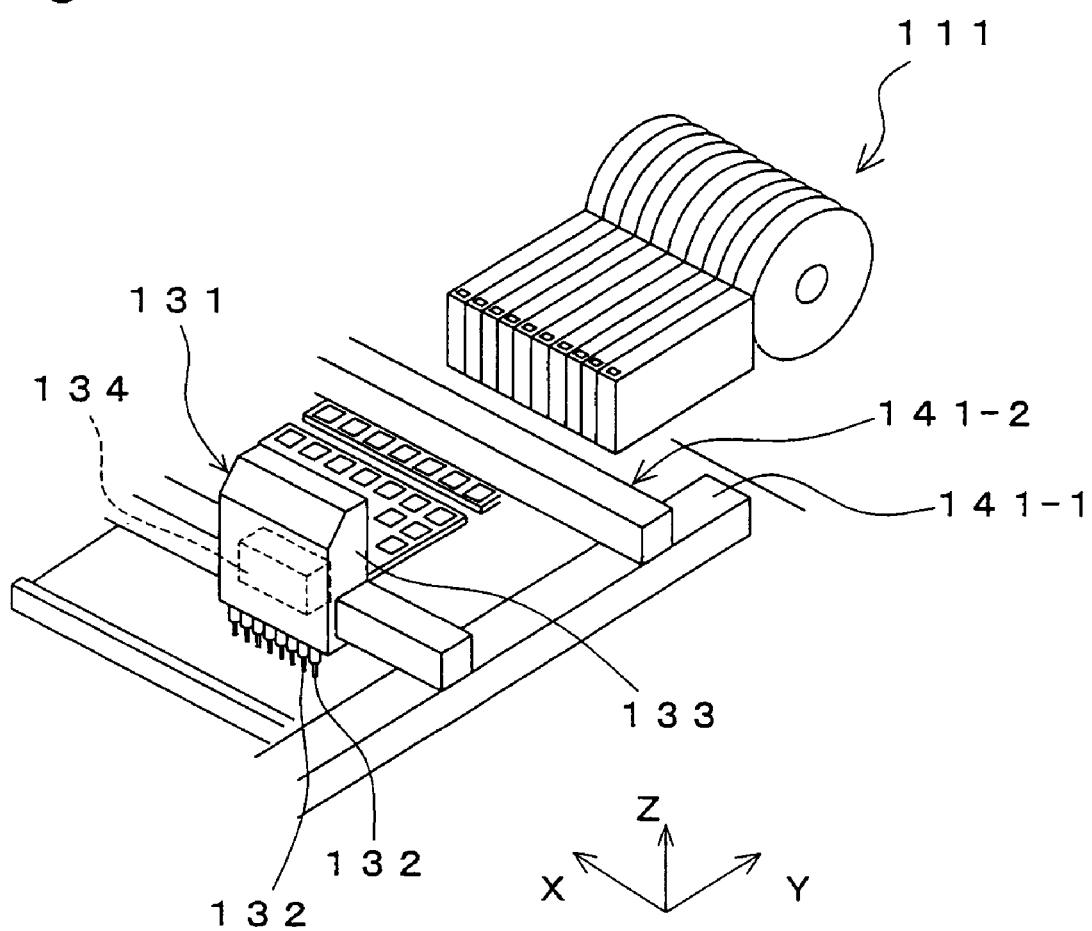
FIG. 2 is a perspective view of the part of a first component feeder and a mounting head shown in FIG. 1.

The first component feeder 111 is a component supply device of a cassette type shown in FIG. 2 which is a supply part for so-called taping type, bulk type and stick type components and feeds first electronic components 112. The first component feeder 111 of FIG. 2 represents a type which feeds taping components wound around a reel.

Figure 3:
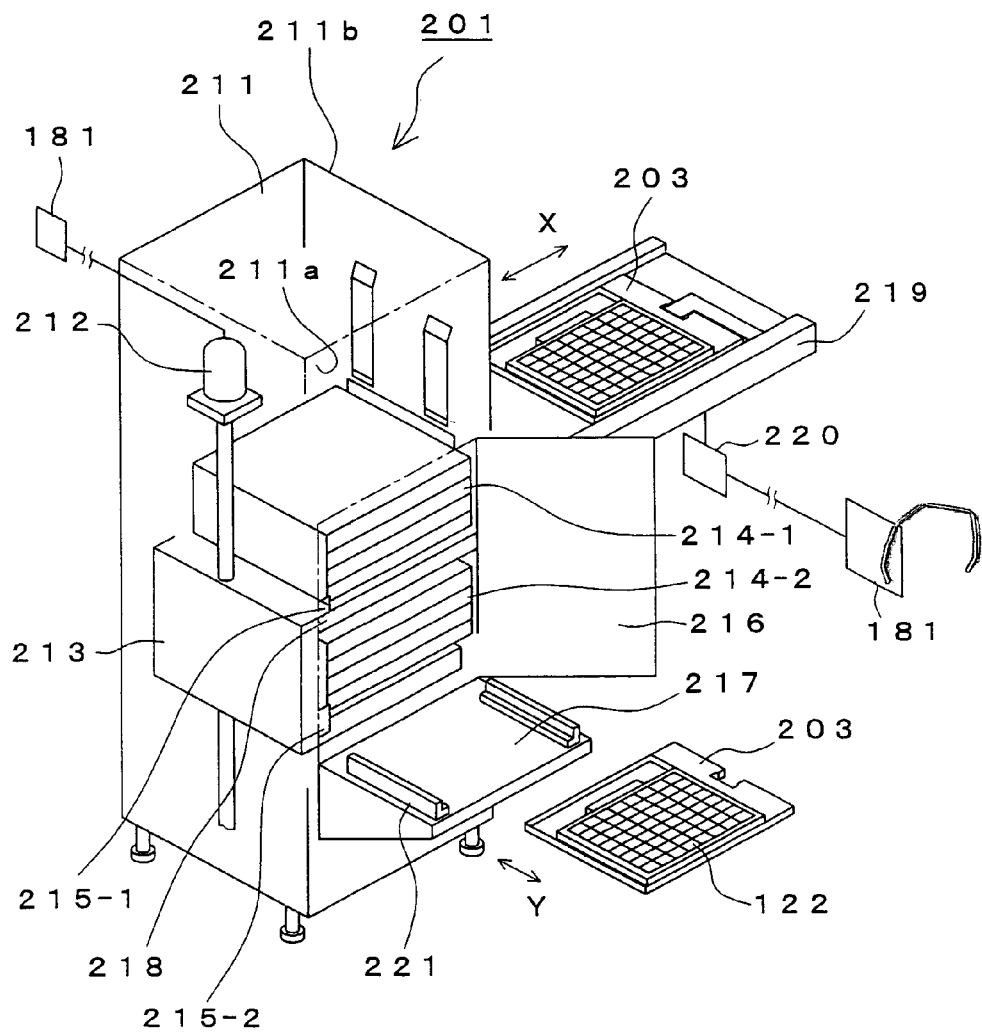
FIG. 3 is a perspective view of a second component feeder shown in FIG. 1.

The second component feeder 201 is a component supply device of a tray type having second electronic components 122 arranged in a grid shape on tray 203, which is configured as will be described below with reference to FIG. 3. A table 213 on which trays 203 can be loaded in layers is installed to be movable up and down within a body frame 211 of the second component feeder 201. The table 213 is moved up and down by a table up/down device 212 installed in the body frame 211. Two magazines 214-1 and 214-2 are secured by magazine fixtures 215-1 and 215-2 and loaded vertically on the table 213. A plurality of trays 203 on which second electronic components 122 of various kinds are loaded are stacked and stored within the magazines 214-1 and 214-2. An opening/closing door 216 and a magazine stage 217 are attached at a side face 211a for tray replacement of the body frame 211, and two rails 221 are laid on the magazine stage 217.

A tray take-out stage 219 is attached at a side face 211b for tray take-out of the body frame 211, extending to the tray component feed position 124 in the electronic component mounting apparatus 101. One of the trays 203 stored in the magazine 214 is drawn out along the X-direction from within the body frame 211 onto the tray take-out stage 219 to serve for the supply of second electronic components 122. Selection of a tray 203 to be taken out onto the tray take-out stage 219 from within the body frame 211 is performed by positioning a desired tray 203 to be even with the tray take-out stage 219 by the table up/down device 212 on a basis of the control of the controller 181. The above take-out operation of the tray 203 and storing operation into the body frame 211 are performed by a tray mover 220 which is installed, for example, at the tray take-out stage 219 and corresponds to an example of exerting the function of a second electronic component mover. An AC servomotor or a device with a cylinder drive or the like can be normally used as the tray mover 220. An operation control for the tray mover 220 is executed by the controller 181. A guide 218 is attached inside the opening/closing door 216. The guide 218 prevents the tray 203 from rattling in the Y-direction when the tray 203 is stored into the magazine 214.

In the above configuration, at a time of replenishing the tray 203 with second electronic components 122, the table 213 is moved by the table up/down device 212 to a home position of the table up/down device 212. A height of the home position is made to agree with a detachable/attachable height of the lower magazine 214-2. The lower magazine 214-2 is slid horizontally to the rails 221 on the magazine stage 217 and taken out by opening the opening/closing door 216 and releasing the magazine fixture 215-2. Then, another magazine 214-2 filled with second electronic components 122 is set. Components can thus be replenished at a time. Moreover, any tray 203 can be replaced with second electronic components 122 by opening the opening/closing door 216 thereby drawing out all trays 203 in the Y-direction at the height of the home position.

According to the second component feeder 201, even when component replenishment is frequently performed during operation of the component mounting facility, all trays 203 can be taken in and out by opening the opening/closing door 216, thus enabling the component replenishment in a short time without necessity of moving the table 213 up and down during a tray detachable/attachable work. At the same time, an accident of dropping a magazine not present at the magazine detachable/attachable height, namely, the magazine 214-1 in this example during the work can be prevented by making the magazine inseparable by the magazine fixture 215-1. Thus components can be replenished safely and in a short time.

The mounting head 131 is movable in mutually orthogonal X and Y-directions, and catches at least the first electronic components 112 from the first component feeder 111 and mounts the components on the circuit board 152. The catching of electronic components is performed, as indicated in FIG. 2, by component holders 132 installed at the mounting head 131. Although a plurality of component holders 132 are installed in the example as represented in the drawing, needless to say, one holder will do. The component holder 132 in the present embodiment is a suction nozzle, and a suction device is connected to the suction nozzle although not shown in the drawing. Furthermore, the component holder 132 is moved in a Z-direction orthogonal to the X and Y-directions by a lift 134 fitted in a body 133 of the mounting head 131. Also the component holder 132 is designed detachably and attachably to the lift 134. The lift 134 and the suction device are operation controlled by the controller 181, similar to the mounting head 131.

The mounting head 131 is rendered freely movable in the X and Y-directions by the mounting head moving unit 141. The mounting head moving unit 141 includes two Y-movers 141-1 which have, for instance, a ball screw mechanism and extend in parallel to each other along the Y-direction, and X-movers 141-2 which stretch between the two Y-movers 141-1 to extend in the X-direction and have, e.g., a ball screw mechanism similarly, with the mounting heads 131 attached thereat. The X-mover 141-2 is moved in the Y-direction by the Y-movers 141-1, whereby the mounting head 131 is moved in the Y-direction. In addition, the mounting head 131 is moved in the X-direction by the X-mover 141-2. Accordingly, the mounting head 131 can be freely moved in X and Y-directions by the Y-movers 141-1 and the X-mover 141-2. As indicated in the drawing, two X-movers 141-2 are installed and consequently two mounting heads 131 are present in the present embodiment. The controller 181 operation controls the mounting head moving unit 141 to control the movement of the mounting head 131.

The image pick-up device has the earlier-referred image pick-up cameras 161, and an image processing device 183 installed in the controller for processing image information sent by the image pick-up cameras 161. Although the image pick-up camera 161 is a camera for acquiring three-dimensional image information in the instant embodiment, it can be for two-dimensional image information. Or two cameras for two-dimensional image information and for three-dimensional image information respectively may be installed.

In the electronic component mounting apparatus 101 of the embodiment, a component mounting work zone 170 is divided to two of a first mounting zone 171 and a second mounting zone 172 along the component transfer direction 154. The circuit board transfer device 151 includes a loader for carrying in the circuit board 152 to the electronic component mounting apparatus 101, a first circuit board transfer and hold unit 156 arranged in the first mounting zone 171 with having a pair of support rail parts 156a and 156b set for transferring and holding the circuit board 152 carried in from the loader, a second circuit board transfer and hold unit 157 arranged in the second mounting zone 172 with having a pair of support rail parts 157a and 157b set for transferring and holding the circuit board 152 transferred from the first circuit board transfer and hold unit 156, and an unloader to which the circuit board 152 is carried from the second circuit board transfer and hold unit 157 and which sends out the circuit board 152. The circuit board transfer device 151 is equipped with a driver 158 for transferring the circuit board 152 at the loader, first circuit board transfer and hold unit 156, second circuit board transfer and hold unit 157 and unloader. The thus-constituted circuit board transfer device 151 is operation controlled by the controller 181.

The controller 181 executes the operation control for the above-described each constituent part, thereby controlling the operation of the electronic component mounting apparatus 101. The controller 181 has a memory part 182 in addition to the aforementioned image processing device 183. For example, the so-called NC program and the like necessary at the time of performing a mounting operation in the electronic component mounting apparatus 101 is stored in the memory part 182. Moreover, according to the embodiment, a program necessary for an interference avoiding operation between the first electronic component(s) 112 or component holder(s) 132 and the second electronic component(s) 122 to be detailed in the following operation description is also stored in the memory part 182. At least height information, more preferably shape information at the first electronic components 112 and second electronic components 122, which becomes necessary when the program for interference avoidance is executed is stored as well.

Although not indicated in FIG. 1, a nozzle station may be arranged for storing replacement component holders to be replaced with the component holders 132 fitted at the mounting heads 131 and for replacing these holders.

Operation in the electronic component mounting apparatus 101 constituted as described above, that is, the electronic component mounting method will be depicted below. Since the operation of carrying in and out the circuit board 152 to the electronic component mounting apparatus 101 and the operation of mounting components to the circuit board 152 by the mounting heads 131 are similar to those in the conventional mounting apparatus, detailed description will be omitted here. Operation of avoiding an interference, which is one of featuring operations in the present embodiment, between at least one of component holder(s) 132 and first electronic component(s) 112, and second electronic component(s) 122 placed on the tray 203 when the mounting head 131 passes over the tray 203 will be discussed in detail hereinafter. Each operation below is performed by control operation of the controller 181. As shown in FIG. 1, since the electronic component mounting apparatus 101 has every two sets of first component feeder 111, mounting head 131 and the like, the mounting operation is actually performed independently of each other by the constituent parts of each set. However, the description below will be representatively focused on either one of the sets. Additionally, although the mounting head 131 has a plurality of component holders 132, and operations of holding components, mounting components and the like are actually performed for each of the component holders 132 in the embodiment as above, the description below will be directed to the operations at only one component holder.

The circuit boards 152 are carried in by the circuit board transfer device 151, held by the first circuit board transfer and hold unit 156 and the second circuit board transfer and hold unit 157 respectively, and positioned.

Then, as an initial state, the mounting head 131 is returned to the home position by driving the Y-movers 141-1 and the X-mover 141-2 of the mounting head moving unit 141. The mounting head moving unit 141 moves the mounting head 131 from the home position to the first component feeder 111B to make the component holder 132 of the mounting head 131 suck the first electronic component 112. At this time, the mounting head 131 passes over the tray 203 of the second component feeder 201 located at the tray component feed position 124 in some cases. In such case, second electronic component(s) 122 placed on the tray 203 may interfere with component holder 132 of the mounting head 131.

For avoiding the above interference, before the mounting head 131 passes over the tray 203, the tray 203 is retreated by the tray mover 220 through the control operation of the controller 181 to the second component feeder 201 to the vicinity of the body frame 211, preferably to a retreat position 125 in the body frame 211 along an incoming/outgoing direction 222. FIG. 1 is illustrated on the basis of a case in which the retreat position 125 is set in the body frame 211. Owing to the retreat operation of the tray 203, the second electronic component(s) 122 is prevented from being on a track of the component holder 132 when the component holder 132 of the mounting head 131 is moved by the mounting head moving unit 141 to the first component feeder 111B, so that the mounting head 131 can move to the first component feeder 111B without the interference brought about between the component holder 132 and the second electronic component(s) 122.

At a time when the mounting head 131 completely moves to an electronic component feed position of the first component feeder 111B, the component holder 132 is moved down by the lift 134 installed in the mounting head 131 to hold a first electronic component 112.

Before the first electronic component 112 is mounted on the circuit board 152 after the first electronic component 112 is held, for measuring a suction position of the first electronic component 112, the mounting head 131 is moved to above the image pick-up camera 161 in a state while the first electronic component 112 is held by the component holder 132. After imaging, a movement amount of the mounting head 131 is corrected on the basis of measurement result of a component position obtained by the image processing device 183, and the component holder 132 is positioned to a mounting position on the circuit board 152 to perform component mounting.

When the component holder 132 is positioned to the mounting position on the circuit board 152 with the correction amount taken into account, and if a next component supply is also performed from the first component feeder 111B, the tray 203 maintains the above retreat state. On the other hand, if the next component supply is performed from the tray 203, the tray 203 is moved to the tray component feed position 124 while the component holder 132 is moving to a mounting region above the circuit board 152 or at a time when the component holder 132 completely moves to the mounting region.

As depicted hereinabove, according to the present embodiment, the retreat operation of the tray 203 prevents a component holder 132 of the mounting head 131 from interfering with second electronic component(s) 122 on the tray 203. Therefore, when the mounting head 131 is moved, detouring while avoiding above the tray 203 becomes unnecessary and a cycle time required for mounting operation can be shortened. Furthermore, the tray 203 of the second component feeder 201 can be disposed at a section between the circuit board transfer device 151 and the first component feeder 111B, so that a space in the electronic component mounting apparatus 101 can be saved.

Although the above example depicts the interference avoidance between a component holder 132 and second electronic component(s) 122 on the tray 203, the retreat operation of the tray 203 is applicable also to a case in which the mounting head 131 is necessary to pass over the tray 203 after a first electronic component 112 is held by a component holder 132 from the first component feeder 111B. In other words, the tray 203 can be retreated beforehand to the retreat position 125 as described above in the case where the mounting head 131 with holding the first electronic component 121 by the component holder 132 passes over the tray 203.

Modified examples of the interference avoiding operation between the component holder 132 and the second electronic component(s) 122 or the interference avoiding operation between the first electronic component 112 and the second electronic component(s) 122 will be discussed below.

(First Modification)

The above-described embodiment is configured to always retreat the tray 203 to the retreat position 125 when the mounting head 131 passes over the tray 203 arranged at the tray component feed position 124. This first modification features to judge whether or not the retreat operation is necessary.

Specifically, as described earlier, the controller 181 has information related to the mounting operation such as the aforementioned NC program, and height information of second electronic components 122 on the tray 203 and height information of first electronic components 112 held by component holders 132. The number, shape and dimensions of component holders 132 attached to the mounting head 131 are also grasped. Therefore, the controller 181 can determine the presence or absence of the interference between at least one of the component holder 132 and the first electronic component 112 held by the component holder 132, and the second electronic components 122 on the tray 203 when the controller makes the mounting head 131 move. The tray 203 can be retreated beforehand to the retreat position 125 as described above only when the interference is determined to occur. To the contrary, the retreat operation of the tray 203 is unnecessary when it is determined that the interference does not take place, and consequently the retreat operation is not performed.

Needless to say, the first modification can obtain the effects acquired by the foregoing embodiment. Moreover, it is rendered enough to retreat the tray 203 only when the interference takes place, so that a useless retreat operation of the tray 203 can be omitted. Whether or not the retreat operation is to be performed can be flexibly met according to types of second electronic components 122 placed on the tray 203.

(Second Modification)

This modification relates to retreat operation of the tray 203 in a case where the component holder 132 holding the first electronic component 112 is moved down above the image pick-up camera 161 to image the first electronic component 112 so as to image hold posture of the first electronic component 112 by the image pick-up camera 161 after the first electronic component 112 is caught from the first component feeder 111B by the component holder 132 of the mounting head 131. This modification will be detailed herein below.

As discussed in the above first modification, the controller 181 can determine the presence or absence of the interference between at least either of the component holder 132 and first electronic component 112 held by the component holder 132, and the second electronic component(s) 122 on the tray 203. When it is determined by the controller 181 that the interference is brought about at the time of the imaging operation, for avoiding the interference between at least either of component holder 132 of the mounting head 131 and first electronic component 112 held by the component holder 132, and the second electronic component(s) 122 on the tray 203 disposed at the tray component feed position 124, the controller 181 executes operation control to the tray mover 220 to move the tray 203 from the tray component feed position 124 to the retreat position 125 before the component holder 132 is moved down above the image pick-up camera 161 after the first electronic component 112 is caught from the first component feeder 111B.

When deciding the absence of occurrence of the interference, the controller 181 does not perform the retreat operation of the tray 203.

According to the second modification, not only the effects acquired by the above-described embodiment can be provided, but also the interference between at least either of component holder 132 and first electronic component 112 held by the component holder 132, and the second electronic component(s) 122 can be avoided at the imaging time by the image pick-up camera 161. Therefore, although a distance between the image pick-up camera 161 and the tray 203 disposed at the tray component feed position 124 is illustrated relatively large in FIG. 1, the distance can be made much shorter. Thus the electronic component mounting apparatus can be constructed more compact as compared with the foregoing embodiment and first modification.

(Third Modification)

Although the tray 203 is retreated to the retreat position 125 in the above embodiment and each modification, an interference avoidance according to the third modification is achieved by moving up the component holder 132 by the lift 134, which will be described in detail below.

Figure 4:
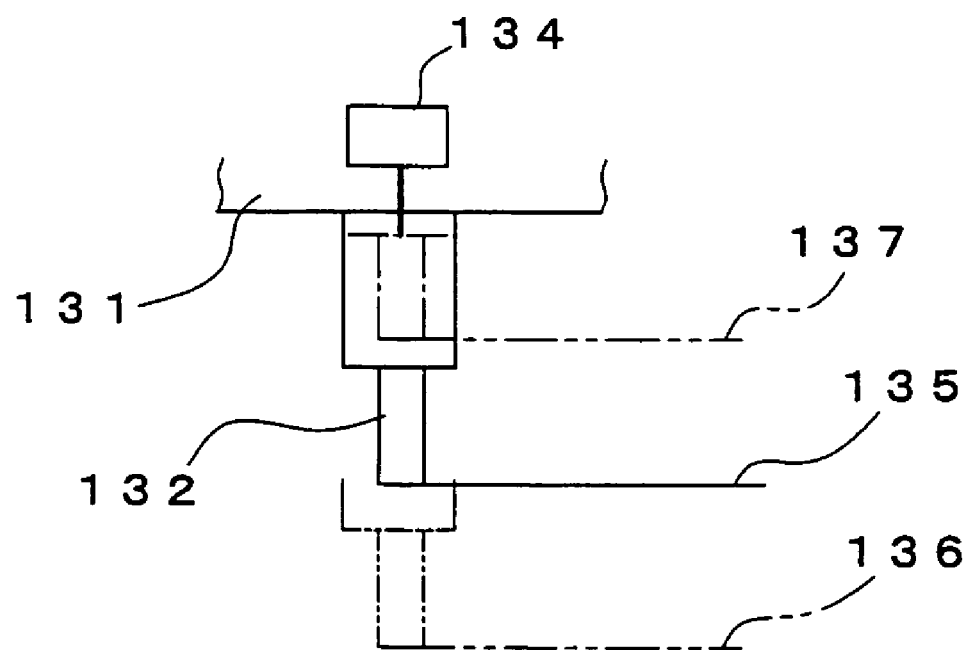
FIG. 4 is a diagram for explaining an up-and-down position at a component holder of the mounting head shown in FIG. 1.
Figure 5:
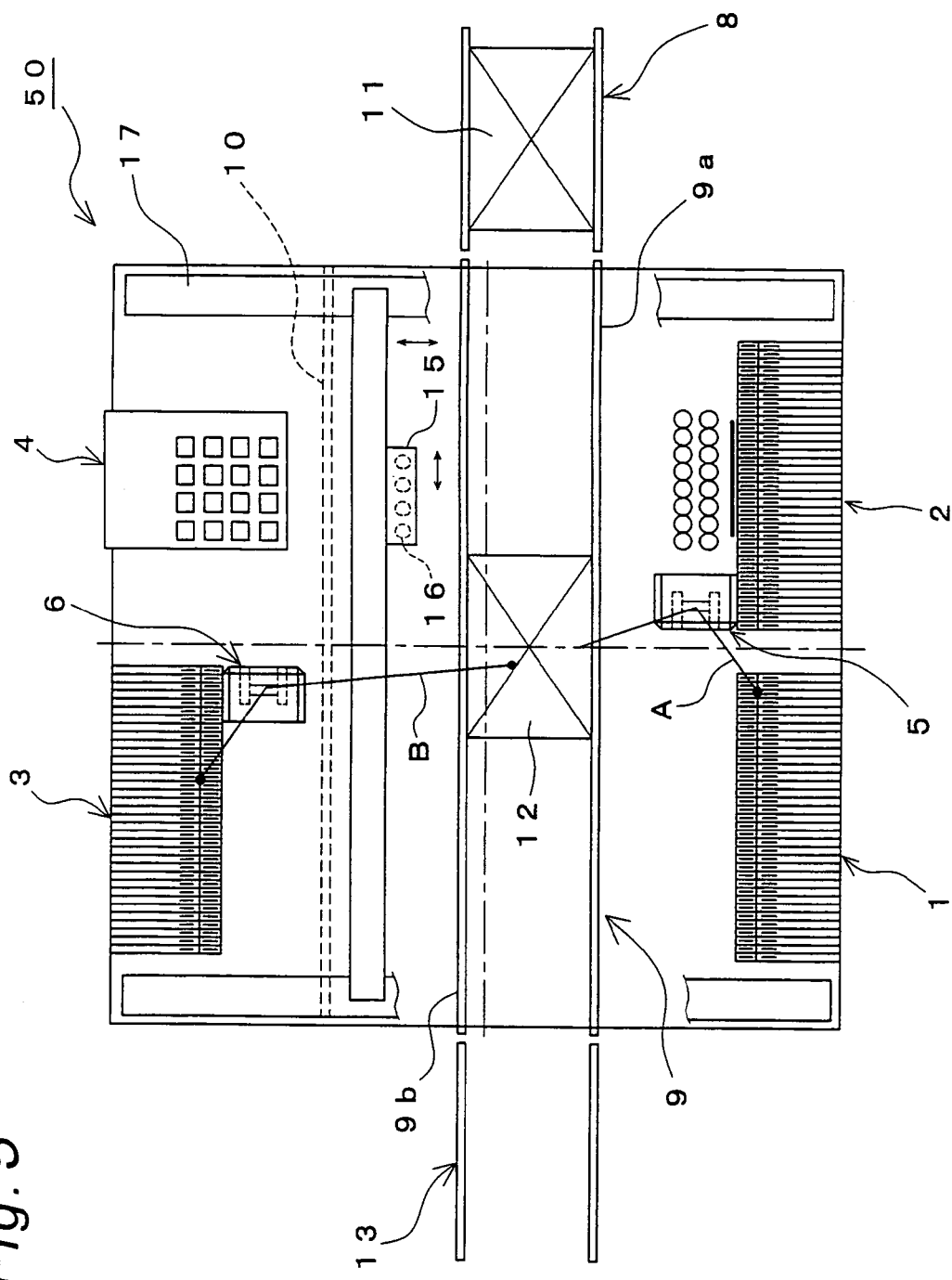
FIG. 5 is a plan view of a conventional electronic component mounting machine.
Figure 6:
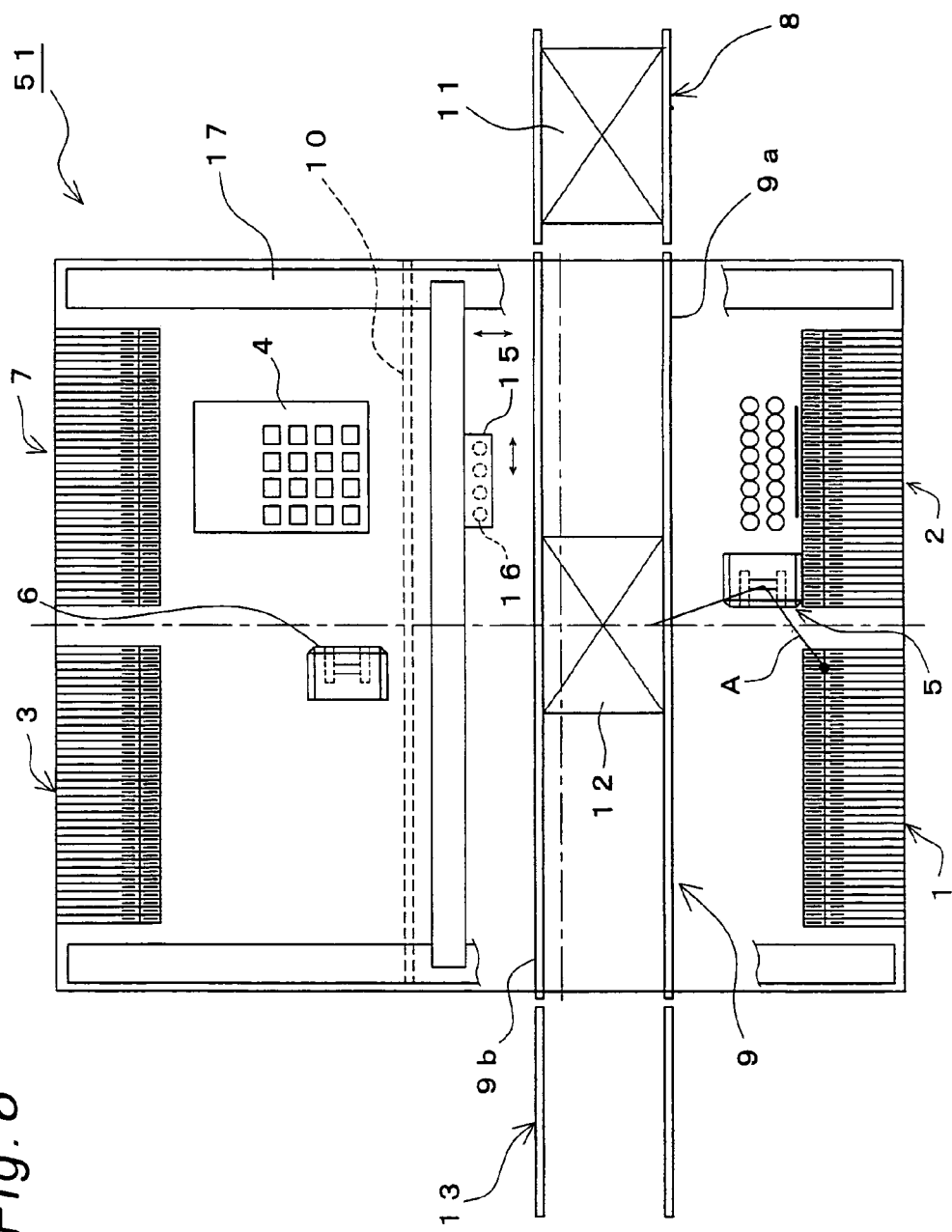
FIG. 6 is a plan view of a conventional electronic component mounting machine.

Similar to the above-described first modification and second modification, the controller 181 can determine the presence or absence of the interference between at least either of the component holder 132 and first electronic component 112 held by the component holder 132, and the second electronic component(s) 122 on the tray 203. In the case where the mounting head 131 passes over the tray 203 disposed at the tray component feed position 124 and when it is determined by the controller 181 that the interference arises, the controller 181 performs operation control for the lift 134 thereby moving up the component holder 132 located at a normal position 135 to a holder retreat position 137 as indicated in FIG. 4.

The holder retreat position 137 is a position where there is no interference between both of lower ends of the first electronic components 112 held by component holders 132 and the component holders 132 without holding the electronic components 112 and 122, and upper ends of the second electronic components 122 placed on the tray 203, and moreover a gap including an allowance with product errors taken into account is formed. The gap is specifically a gap of, for example, approximately 1 mm.

The normal position 135 is a level where the component holders 132 without holding the electronic components 112 and 122, and the component holders 132 in a state while holding components are arranged. A down position 136 is a level where the component holders 132 are arranged when the component holders are to hold electronic components 112 and 122 and to mount held electronic components 112 and 122 on the circuit board 152.

When determining that the interference is not brought about, the controller 181 does not perform the retreat operation of component holders 132.

According to this third modification, similar to the foregoing embodiment, detouring to avoid over the tray 203 at the moving time of the mounting head 131 is eliminated, thus shortening the cycle time required for mounting. Furthermore, the tray 203 of the second component feeder 201 can be arranged in a section between the circuit board transfer device 151 and the first component feeder 111B as shown in FIG. 1, saving the space in the electronic component mounting apparatus 101.

Unless the interference is avoidable by only the operation of moving up component holders 132, the retreat operation of the tray 203 may be performed, or the retreat operation of the tray 203 may be performed without the raising operation of component holders 132.

It is advantageous in the following case to perform the retreat by moving up component holders 132 as above. Specifically, in a case where, as a plurality of component holders 132 are installed at the mounting head 131 as above, further the second electronic components 122 are to be caught from the tray 203 in a state, for instance, with the first electronic components 112 being held from the component feeder 111, the second electronic components 122 cannot be caught if the tray 203 is retreated. In such event, to catch the second electronic components 122 from the tray 203 is enabled by moving up the component holders 132, which contributes to shortening the cycle time in the mounting operation.

In the above third modification, such an arrangement can be adopted that the tray 203 of the second component feeder 201 is fixed to the tray component feed position 124 not to move. By the arrangement, not only the effects acquired by the above embodiment can be obtained, but the second component feeder with the structure simplified in comparison with the electronic component mounting apparatus 101 in the embodiment or the like can be provided. A cost reduction and the like are achieved accordingly.

In the foregoing description, the component holders 132 of the mounting head 131 hold the first electronic components 112 and second electronic components 122 by the suction operation. However, the component holders are not limited to this form. For instance, component holders that hold electronic components mechanically will do.

The electronic component mounting apparatus 101 has every two sets for the first component feeder 111, mounting head 131 and the like. However, the electronic component mounting apparatus 101 is not restricted to FIG. 1 in terms of the constitution and can be a type, e.g., with two circuit board transfer devices 151 arranged in parallel to each other.

According to the electronic component mounting apparatus of the first aspect of the present invention and the electronic component mounting method of the second aspect as is fully described above, the controller is provided, so that the retreat control of second electronic components is performed to the second component feeder so as to avoid the interference if at least either of the first electronic components and the component holders interfere with the second electronic components of the second component feeder because of the movement of the mounting head. Conventionally, although component holders are moved up to avoid interference between the component holders and the first electronic components, and the second electronic components, a movement amount of the component holders to a height with a maximum limit of specifications of the electronic component mounting machine taken into account becomes large, and a movement time is rendered lengthy, which is a great reason for an impediment to shortening the cycle time in mounting.

On the other hand, according to the above first and second aspects of the present invention, the interference is avoided by executing the retreat control of second electronic components, so that the time conventionally required for moving up and down component holders can be reduced, and also the need of uselessly moving along a detour at the time of moving the mounting head is eliminated. The cycle time can be shortened and costs can be reduced eventually.

In addition, the above retreat operation enables the second component feeder to be arranged in the section between the circuit board arrangement zone and the first component feeder, and the electronic component mounting apparatus can be made space-saving.

By installing the image pick-up device, the interference can be avoided through the above retreat operation even if the interference is brought about at the time of the imaging operation. The image pick-up device and the second component feeder can be disposed adjacent to each other, thus making the electronic component mounting apparatus space-saving.

The presence or absence of the interference is determined on the basis of height information of electronic components, and whether or not the retreat operation is necessary is decided on the basis of the result of the determination, whereby the execution of a wasteful retreat operation can be avoided.

A suitable combination of any aspects among the above various aspects can provide effects of respective aspects.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus in which a second component feeder that supplies a second electronic component from a tray where the second electronic component is loaded is arranged at a section set between a mounting zone where a board mounting at least a first electronic component is disposed and a first component feeder that supplies the first electronic component, said electronic component mounting apparatus comprising:

a mounting head configured to have a component holders that move up and down with holding the first and second electronic components, to be movable in mutually orthogonal X and Y-directions, and to hold at least the first electronic component from the first component feeder and mount the first electronic component on the board;

a second electronic component mover configured to be installed in the second component feeder, and to retreat the second electronic component when at least either of the first electronic component held by the mounting head from the first component feeder and the component holder interferes with the second electronic component of the second component feeder because of movement of the mounting head; and a controller configured to perform operation control for the first component feeder, the second component feeder, the second electronic component mover and the mounting head, to have a memory part that stores height information of the first electronic component and the second electronic component, to determine presence or absence of the interference on a basis of the height information of the first electronic component held by the mounting head and the height information of the second electronic component at the second component feeder, and to perform retreat control to the second electronic component mover when the interference arises.

2. The electronic component mounting apparatus according to claim 1, which further comprises an image pick-up device arranged adjacent to the second component feeder and configured to image hold postures of the first electronic component and the second electronic component held by the mounting head, wherein the controller performs retreat control for the second electronic component to the second electronic component mover when the first electronic component interferes with the second electronic component at a time of movement for imaging the first electronic component.

3. The electronic component mounting apparatus according to claim 1, wherein the controller further makes the mounting head move up the component holder to retreat the first electronic component.

4. An electronic component mounting method performed by an electronic component mounting apparatus in which a second component feeder that supplies a second electronic component is arranged at a section set between a mounting zone where a board mounting at least a first electronic component is disposed and a first component feeder that supplies the first electronic component, the method comprising:

determining whether or not at least either of a component holder and the first electronic component held by the component holder interferes with the second electronic component of the second component feeder on a basis of height information of the first electronic component held by a mounting head, and height information of the second electronic component at the second component feeder when the mounting head having the component holders which move up and down with holding the first and second electronic components passes over the second component feeder; and performing avoidance operation of the interference to the second component feeder.

5. The electronic component mounting method according to claim 4, wherein in a case where component mounting is performed on the board after picking up image of hold postures of the first and second electronic components held by the mounting head, retreat of the second electronic component is performed to the second component feeder if the first electronic component interferes with the second electronic component at a time of imaging the first electronic component.

6. The electronic component mounting apparatus according to claim 2, wherein the controller further makes the mounting head move up the component holder to retreat the first electronic component.

* * * * *